(12) United States Patent
Lewko (10) Patent No.: US 7,436,217 B2
(45) Date of Patent: Oct. 14, 2008

(54) METHODS AND APPARATUS FOR SERIALLY CONNECTED DEVICES

(75) Inventor: Zachary D. Lewko, Lowell, MA (US)

(73) Assignee: Allegro Microsystems, Inc., Worcester, MA (US)

( * ) Notice: Subject to any disclaimer, the term of this patent is extended or adjusted under 35 U.S.C. 154(b) by 107 days.

(21) Appl. No.: 11/426,626

(22) Filed: Jun. 27, 2006

(65) Prior Publication Data

US 2007/0296464 A1   Dec. 27, 2007

(51) Int. Cl.
*H03K 19/00* (2006.01)
(52) U.S. Cl. .......................... 326/93; 326/46
(58) Field of Classification Search ............ 326/37, 326/38, 46, 93–98; 345/204
See application file for complete search history.

(56) References Cited

U.S. PATENT DOCUMENTS

| | | | | |
|---|---|---|---|---|
| 5,136,622 | A | * | 8/1992 | Plus .............................. 377/64 |
| 6,859,070 | B2 | * | 2/2005 | Urakawa et al. .............. 326/93 |
| 2004/0100459 | A1 | | 5/2004 | Wu et al. |

OTHER PUBLICATIONS

Datasheet, Maxim 16-Output PWM LED Drivers for Message Boards, Maxim Integrated Products, May 2006, 23 pages.
Datasheet, Allegro 6275, 8-Bit Serial-Input, Constant-Current Latched LED Driver, Allegro Microsystems, Inc., 2000, 2003, 12 pages.
Datasheet, Opto Tech Di-043PO 3-Channel LED Display Driver IC, Opto Tech Corporation, Feb. 2005, 3 pages.
Datasheet, DM413, 3 Channel Constant Current LED Drivers With Programmable PWM Outputs, Silicon Touch Technology, Inc., Mar. 15, 2005, 18 pages.
Datasheet, Allegro 6280, 3 Bit-Constant Current LED Driver with PWM Current Control, Aug. 11, 2005, 10 pages.
Article, Sink Driver Helps Cascade, Control LED Clusters, Electronic Engineering Times, Apr. 2006, 1 page.
Datasheet, MB16010, 3-Channel Driver for RGB LED Cluster, Macroblock, Inc., Sep. 2004, 4 pages.

* cited by examiner

*Primary Examiner*—Don P Le
(74) *Attorney, Agent, or Firm*—Daly, Crowley, Mofford & Durkee, LLP (57) ABSTRACT

Apparatus and methods for processing a clock input signal with a clock regeneration circuit to provide a clock output signal for coupling to a cascaded device. The clock output signal has a period substantially equal to the period of the clock input signal and a duty cycle independent of the duty cycle of the clock input signal. In one embodiment, the clock regeneration circuit includes a one-shot and a buffer. Also described are apparatus and methods for aligning a data output signal of a cascaded device to non-clock-triggering edges of a selected one of the clock input signal and the clock output signal.

24 Claims, 6 Drawing Sheets

METHODS AND APPARATUS FOR SERIALLY CONNECTED DEVICES

CROSS REFERENCE TO RELATED APPLICATIONS

Not Applicable.

STATEMENT REGARDING FEDERALLY SPONSORED RESEARCH

Not Applicable.

FIELD OF THE INVENTION

This invention relates generally to cascaded devices and, more particularly, to methods and apparatus associated with providing a clock signal to a plurality of cascaded devices and aligning output data of the devices with a clock signal.

BACKGROUND OF THE INVENTION

Electronic devices of various types are often coupled in series with like devices (also referred to as being "cascaded" or "daisy-chained") in order to meet application requirements without requiring multiple connections to a common controller. For example, serial data devices are often coupled in series to avoid the need for a common microcontroller or microprocessor to individually address each device. In this type of an arrangement, the serial data output of one device is coupled to the serial data input of the next successive device. Illustrative devices of this type include drivers, such as display drivers, which are often cascaded in order to drive a number of display devices or device segments without requiring multiple microprocessor connections.

In such configurations, a common clock signal is typically used to ensure that the data shifted from one device to the next will remain synchronous, thereby ensuring data integrity. However, having large numbers of devices sharing the common clock signal is undesirable in some types of systems. For example in some systems, the devices receiving data may be located remotely from the controlling device and each other, connected with the use of a daisy-chained wiring harness. In such systems, the loading on the common clock line, due to the large number of controlled devices, results in greatly increased drive requirements for the clock signal. Furthermore, the long length of the daisy-chained clock signal line can lead to noise and clock signal reflections that, without the use of more expensive wiring or reduced data rates and filtering, may degrade the noise margin and thus, the data integrity of the system.

To avoid the aforementioned problems, the clock signal entering each controlled device may be buffered and used to drive the clock input of the next controlled device in the serial daisy chain. The buffered clock resolves the aforementioned issues since the clock output signal of each device need only drive the next device in the chain.

However, the buffered clock system can give rise to other issues when the length of the daisy-chain is very long and the data rate desired is high relative to the speed of the controlling system. In such a system, each time the clock signal passes through a controlled device, the logic high portion of the clock signal will be shortened or lengthened due to the nature of the buffer circuitry, thereby causing clock signal skewing and delays that can compromise data integrity. Furthermore, as the clock signal is buffered from one device to the next, the reductions/increases are cumulative and can result in the high or low state of the clock signal disappearing entirely (referred to herein as clock loss) and the total loss of all data for subsequent devices in the daisy chain.

In practice this occurs more commonly than might be expected due to differences in the P channel and N channel MOSFET devices that produce the composite threshold voltage of a standard CMOS logic buffer. For example, even if a buffer is designed to have a nominal half supply voltage threshold and nominally equal falling and rising propagation delays, in a given wafer fabrication lot, due to normal process variation, when the N channel threshold is high and the P channel threshold is low (less negative), the composite threshold of the buffer will be higher than the nominal half supply. In this case, because the incoming clock signal has a finite rising and falling time, the logic high portion of the buffered clock signal will be reduced as compared to the incoming clock signal. Furthermore because all devices in the wafer fabrication lot are likely to be similar, the reduction/increase in the duration of the logic high state will be systematic and can easily result in the total loss of the clock signal when many devices are daisy-chained.

Another issue associated with cascading serial data devices involves ensuring that the output data from one device is clocked into the successive device before a next clock event at the first device causes the output data to be updated. The amount of time necessary for data to be held at the input to a device after the clock edge triggered event to ensure that it will be correctly clocked into the device can be referred to as the "hold time" and the amount of time preceding a clock edge triggered event that data needs to be present at the device input for accurate clocking can be referred to as the "setup time." In one example, output data from a device N is clocked into the successive device N+1 at the moment of a rising edge of the clock signal and this is also the time when new data in the device N begins to transfer to its output. Ideally, propagation delays allow the old data to be clocked into the N+1 device before the new data arrives at the output of the N device.

Some designs simply rely on propagation delays through the serial data output buffer to hold the data long enough for it to be clocked into the next device before the new data arrives at the serial data output. However, this sequence of events cannot be ensured with certainty, particularly given process and temperature variations, thereby risking interference with the correct transfer of data.

One technique for avoiding this race condition is to use synchronous logic that is clocked off another asynchronous clock signal to ensure that no capacitive/delay holding is required. In such cases the data resynchronization may be achieved through the use of other logic circuits. However, such designs have the disadvantage that due to the asynchronous nature of the other clock, the logic and thus the data rate is required to run at a slower speed to ensure that correct operation is maintained.

SUMMARY OF THE INVENTION

According to the invention, a device suitable for coupling in series to at least one other device includes a clock input port for receiving a clock input signal, a clock output port at which a clock output signal is provided for coupling to the other device, and a clock circuit coupled between the clock input port and the clock output port for processing the clock input signal to provide the clock output signal having a period that is substantially equal to the period of the clock input signal and a duty cycle that is independent of the duty cycle of the clock input signal.

In one embodiment, the clock circuit includes a one-shot responsive to the clock input signal to provide a one-shot output signal in a selected one of a logic high state or a logic low state for a predetermined duration and a buffer responsive to the one-shot output signal to provide the clock output signal. The period of the clock input signal is greater than the predetermined duration.

Also described is a method for processing a clock input signal to a serially coupled device in order to provide a clock output signal for coupling to a successive device, including generating a signal having a period substantially equal to a period of the clock input signal and a duty cycle that is independent of a duty cycle of the clock input signal and buffering the signal to provide the clock output signal.

With these arrangements, possible clock loss associated with coupling a buffered version of the same clock signal to a plurality of cascaded devices is eliminated by regenerating the clock input signal to provide a clock output signal that preserves the clock signal period, but that has a duty cycle that is independent of the clock input signal.

According to a further aspect of the invention, a device suitable for coupling in series to at least one other device includes a clock input port for receiving a clock input signal, a clock output port at which a clock output signal is provided for coupling to the other device, a data input port for receiving a data input signal, a data output port at which a data output signal is provided for coupling to the other device, a shift register coupled between the data input port and the data output port and responsive to the clock input signal for shifting the data input signal through the shift register, and a data output signal alignment circuit coupled to a last bit of the shift register to align the data output signal with a selected one of the clock input signal or the clock output signal. More particularly, the data output signal is aligned with non-clock-triggering edges of the selected one of the clock input signal and the clock output signal. In one embodiment, the data output signal alignment circuit includes a flip-flop and the data output signal is provided at an output of the flip-flop.

Also described is a method for processing a data input signal to a series coupled device to provide a data output signal for coupling to a successive device, the device being responsive to a clock input signal and providing a clock output signal to the successive device, the method including aligning the data output signal with non-clock-triggering edges of a selected one of the clock input signal or the clock output signal.

With these arrangements, a loss of data integrity due to insufficient hold and setup times is avoided. This is achieved by aligning the data output signal with non-clock-triggering edges of the clock input signal or the clock output signal, thereby delaying the data output signal to ensure that the data setup and hold times for the next successive device in the cascaded arrangement are met.

BRIEF DESCRIPTION OF THE DRAWINGS

The foregoing features of the invention, as well as the invention itself may be more fully understood from the following detailed description of the drawings, in which.

DETAILED DESCRIPTION OF THE INVENTION

Figure 1:
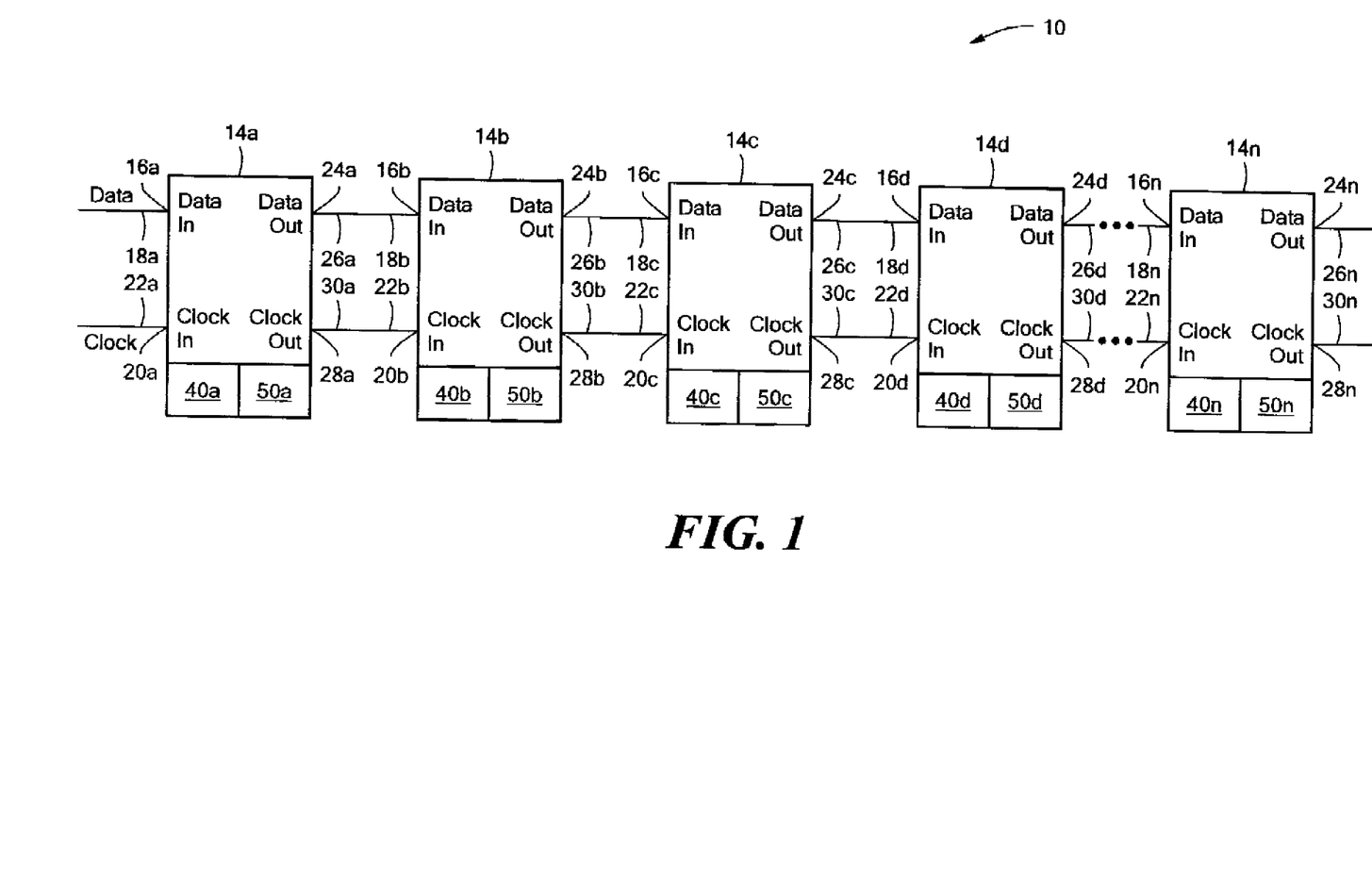
FIG. 1 shows a plurality of cascaded devices each containing a clock signal regeneration circuit and a data output signal alignment circuit according to the invention.

Referring to FIG. 1, a circuit 10 includes a plurality of cascaded devices 14$a$-14$n$, each containing a clock signal regeneration circuit, or simply clock circuit, 40$a$-40$n$ and a data output signal alignment circuit 50$a$-50$n$ according to the invention. As will be described further below, each clock circuit 40$a$-40$n$ processes a respective clock input signal 22$a$-22$n$ to provide a respective clock output signal 30$a$-30$n$ having a period that is substantially equal to the period of the clock input signal and a duty cycle that is independent of the duty cycle of the clock input signal. With this arrangement, the period of the clock input signal is preserved while clock loss is prevented.

As will also be described, each device 14$a$-14$n$ includes a shift register coupled between a data input port and a data output port and each data output signal alignment circuit 50$a$-50$n$ is coupled to a last bit of the respective shift register to align a data output signal with non-clock-triggering edges of a selected one of the clock input signal or the clock output signal, thereby ensuring sufficient hold and setup times for the successive device.

Figure 4:
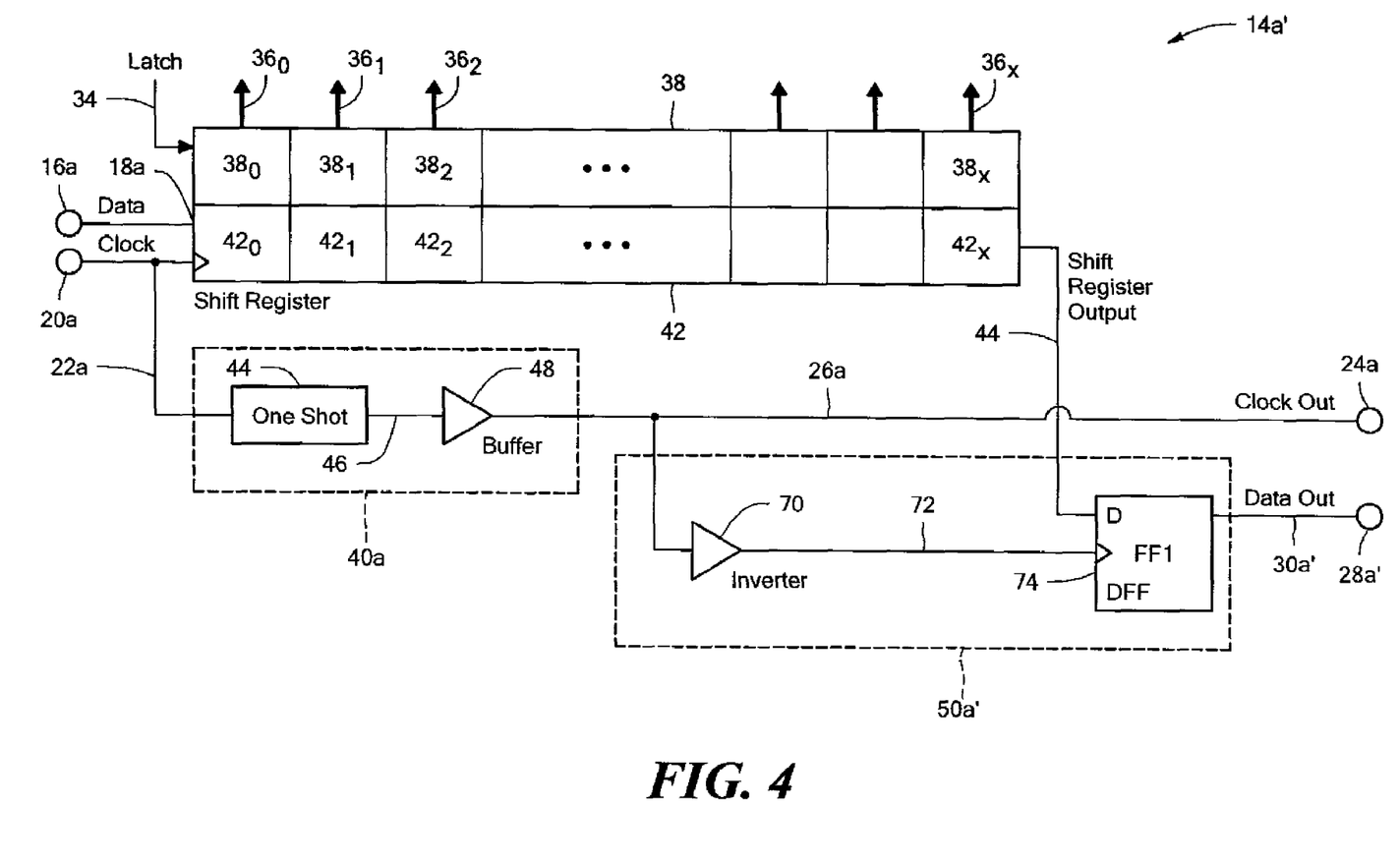
FIG. 4 shows an alternative embodiment for the devices of FIG. 1.

Each of the devices 14$a$-14$n$ is responsive to a data input signal 18$a$-18$n$ and a clock input signal 22$a$-22$n$ and provides a data output signal 26$a$-26$n$ and a clock output signal 30$a$-30$n$, respectively. More particularly, each of the devices 14$a$-14$n$ has a data input port 16$a$-16$n$ that receives a respective data input signal 18$a$-18$n$ and a clock input port 20$a$-20$n$ that receives a respective clock input signal 22$a$-22$n$. Further, each device 14$a$-14$n$ has a data output port 24$a$-24$n$ at which a respective data output signal 26$a$-26$n$ is provided and a clock output port 28$a$-28$n$ at which a respective clock output signal 30$a$-30$n$ is provided, as shown. The devices 14$a$-14$n$ may have additional data output ports at which parallel data is provided, as is shown in FIGS. 2 and 4, for example.

The devices 14$a$-14$n$ are coupled in series (referred to alternatively as being "daisy-chained" or cascaded) with the data output port 24$a$-24$n$-1 of each device 14$a$-14$n$-1 coupled to the data input port 16$b$-16$n$ of the next successive device 14$b$-14$n$ and the clock output port 28$a$-28$n$-1 of each device coupled to the clock input port 20$b$-20$n$ of the next successive device 14$b$-14$n$, respectively, as shown. Thus, the data input signal 18$b$-18$n$ is provided by the data output signal 26$a$-26$n$-1 of the preceding device in the daisy-chain arrangement and the clock input signal 22$b$-22$n$ is provided by the clock output signal 30$a$-30$n$-1 of the preceding device. The data input signal 18$a$ and the clock input signal 22$a$ to the first device 14$a$ in the daisy-chain arrangement are provided by a controller, such as a microprocessor (not shown). The data output signal 26$n$ and the clock output signal 30$n$ of the last device 14$n$ in the daisy-chain arrangement are generally not coupled further.

The devices 14$a$-14$n$, typically in the form of integrated circuits (ICs), may be of various types for use in various applications in which it is desirable to couple more than one such device in series. Illustrative devices include display drivers for use in LED, OLED, LCD and Plasma displays. One particular display driver utilizing the inventive clock circuit and data output signal alignment circuit is described below in connection with FIG. 6. In the illustrative embodiments, the device data input ports 16a-16n are adapted for receiving serial data and the data output ports 24a-24n provide serial data. The number of devices n can be varied to suit a particular application and most generally is greater than one. Further, the devices 14a-14n physically may be located on the same or different circuit boards or other elements in close proximity or remotely with respect to each other. In embodiments in which the devices are mounted on different circuits boards, the signals coupled between the devices may comprise one or more of signal traces on printed circuit boards, wire bonds, cabling, etc.

Figure 2:
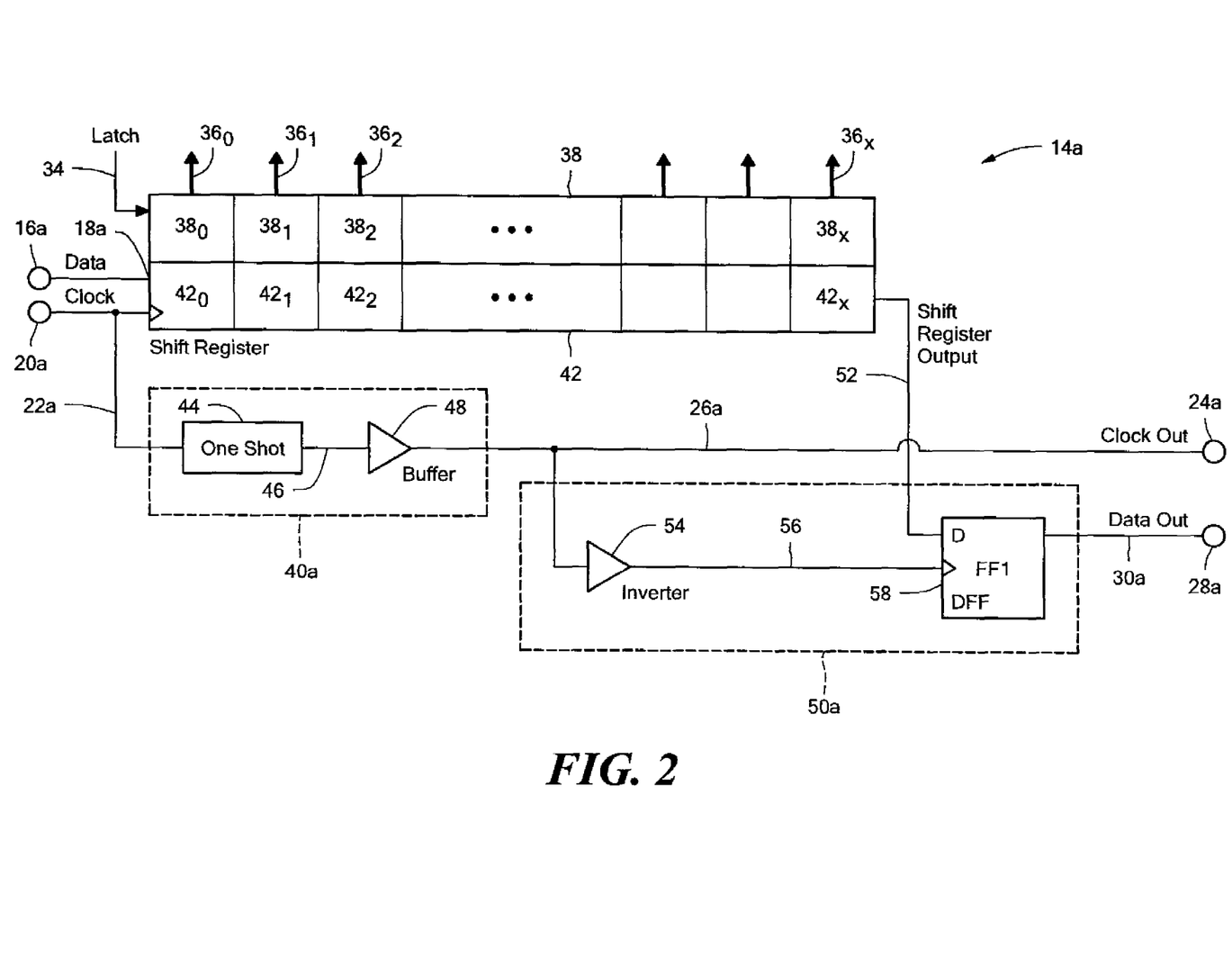
FIG. 2 is a block diagram of an exemplary one of the devices of FIG. 1.

Referring to FIG. 2, a block diagram of an illustrative one 14a of the cascaded devices 14a-14n includes a shift register 42, a data latch 38, the clock circuit 40a, and the data output signal alignment circuit 50a. The shift register 42 processes the serial data input signal 18a in response to the clock input signal 22a and includes a plurality of elements or bits $42_0$-$42_x$, with the most significant bit labeled $42_0$ and the least significant bit labeled $42_x$. The data latch 38 has elements $38_0$-$38_x$ corresponding to the respective elements $42_0$-$42_x$ of the shift register 42 and latches the data from the respective shift register element in response to a latch signal 34, as may be provided by the controller for example. Each of the latch elements $38_0$-$38_x$ provides a respective parallel data output signal $36_0$-$36_x$, as shown.

In operation, upon each rising edge of the clock input signal 22a, data is shifted through the shift register 42. In particular, the data input signal 18a is shifted into the first element $42_0$ of the shift register, the data in the remaining shift register elements $42_1$-$42_{x-1}$ is shifted to the next successive element $42_2$-$42_x$, and the least significant data bit $42_x$ is transferred to the data output signal alignment circuit 50a via signal line 52.

The clock circuit 40a includes a one-shot circuit 44 responsive to the clock input signal 22a for generating the clock output signal 26a. As will be described, the one-shot 44 is operative to generate a one-shot output signal 46 having a selected one of rising or falling edges substantially coinciding with a respective one of rising or falling edges of the clock input signal 22a. During each clock cycle, the one-shot output signal 46 is in a selected one of a logic high state or a logic low state for a predetermined duration. The clock circuit 40a further includes a buffer 48 that buffers the signal 46 to provide the clock output signal 26a. The clock output signal 26a has a period substantially equal to the period of the clock input signal 22a and a duty cycle that is independent of the duty cycle of the clock input signal, since the duty cycle of the clock output signal is set by the one-shot.

In the illustrative embodiment, the one-shot 44 is positive edge triggered. Thus, when a rising edge of the clock input signal 22a occurs, the one-shot 44 drives the signal 46 high for a predetermined duration, such as 100 ns in one illustrative embodiment. The signal 46 then goes low until the next rising edge of the clock input signal occurs. Thus, in the illustrative embodiment, during each clock cycle, the one-shot output signal 46 is in a logic high state for the predetermined duration and each rising edge of the signal 46 substantially coincides with a rising edge of the clock input signal 22a. It will be appreciated by those of ordinary skill in the art that while the illustrative one-shot 44 is a positive edge triggered device, the one-shot may alternatively be a negative edge triggered device in which case the falling edges of the signal 46 would substantially coincide with falling edges of the clock input signal 22a and the one-shot output signal 46 would be in a logic low state for the predetermined duration.

The buffer 48 causes a slight delay between the clock output signal 26a and the one-shot output signal 46. Thus, the rising edges of the clock output signal 26a can be described as being substantially coinciding or aligned with the rising edges of the clock input signal, to account for slight delays due to processing by the buffer 48.

The predetermined duration set by the one-shot 44 must be selected to be large enough to meet the speed requirements of the devices 14a-14n. In other words, the resulting clock pulses must be large enough to allow the devices, for example the shift registers, enough time to shift and store data before the next clock pulse occurs. However, the one-shot duration must not be so long as to interfere with the clock cycle. In other words, the one-shot duration must be less than the period of the clock input signal. Thus, while the predetermined duration illustrated in the waveforms of FIG. 3 and labeled "t" is relatively small compared to the logic high portions of the clock input signal, it will be appreciated that these durations are illustrative only. In fact, the predetermined duration established by the one-shot 44 may be longer than the logic high portions of the clock input signal.

With this arrangement, possible clock signal loss associated with coupling a buffered version of the same clock signal to a plurality of cascaded devices is eliminated by having each device regenerate the clock signal to provide the clock output signal with either rising edges or falling edges substantially coinciding with like edges (either rising or falling) of the clock input signal, thereby preserving the period of the clock signal, but with a duty cycle that is dictated by the one-shot and thus, that is independent of the duty cycle of the input clock signal. This is because the period of the clock input signal is preserved, but since the duty cycle of the clock output signal is established by the one-shot, skewing of the clock signal to the point of 0% or 100% duty cycle (i.e., clock loss) is avoided.

According to a further aspect of the invention, the data output signal alignment circuit 50a includes an inverter 54 to invert the clock output signal 26a and a flip-flop 58 that is clocked by the inverted clock signal 56. The data input to the flip-flop is provided by the least significant bit $42_x$ of the shift register 42 via signal line 52. The output of the flip-flop 58 provides the data output signal 30a for coupling to the data input port 16b of the successive device 14b in the series string of devices.

More generally, the alignment circuit 50a aligns the data output signal 30a with non-clock-triggering edges of the clock output signal 26a. By "non-clock-triggering" it is meant either rising or falling edges, whichever do not cause data to be clocked into the devices 14a-14n. In the illustrative embodiments, the devices are positive edge clocked devices and so, the non-clock-triggering edges of the clock signal are the negative edges. However, it will be appreciated by those of ordinary skill in the art that the devices 14a-14n could alternatively be clocked upon the falling edges of the respective clock input signal, thereby rendering the positive edges of the clock signal the "non-clock-triggering" edges.

With this arrangement, the data output signal 30a is aligned with the falling edges of the clock output signal 26a and thus, is ready at the data input port 16b of the next cascaded device 14b well before the device 14b is next clocked on a rising edge of the clock output signal 26a, thereby ensuring sufficient setup and hold time. Stated differently, with the circuit 50a, the data output signal 30a is essentially delayed by a portion of the clock cycle corresponding to the predetermined one-shot duration so as to ensure that it is available at the input of the next device 14b well before the device 14b is next clocked.

Figure 3:
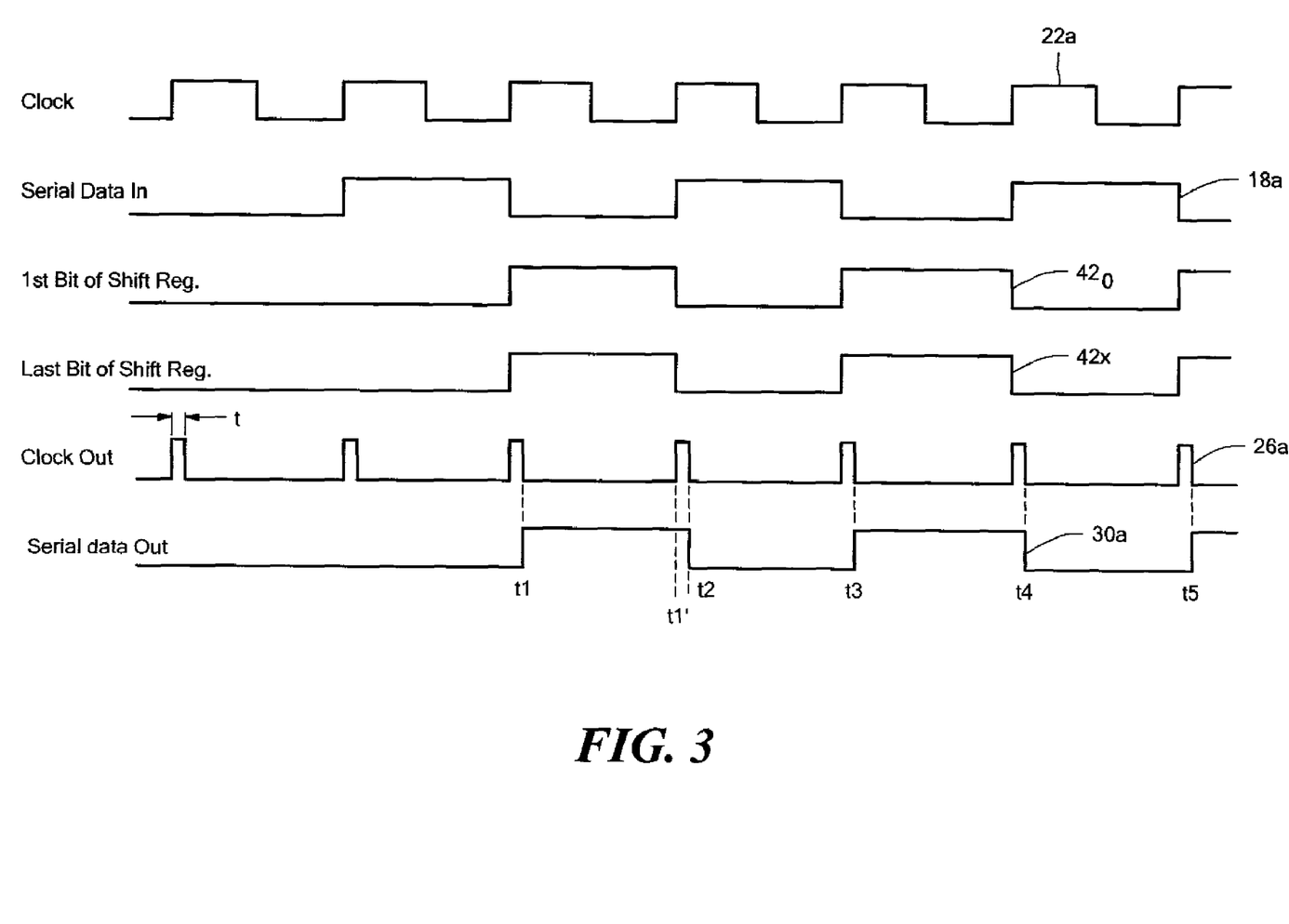
FIG. 3 is a timing diagram showing several illustrative signals associated with the device of FIG. 2.

Referring also to FIG. 3, illustrative waveforms associated with the circuit 14a of FIG. 2 are shown. In particular, the clock input signal 22a, the data input signal 18a, the clock output signal 26a, and the data output signal 30a are shown. Also shown are the least significant bit $42_x$ and the most significant bit $42_0$ of the shift register 42. As is apparent, the clock output signal 26a has rising edges that are substantially aligned with rising edges of the clock input signal 22a. As noted above, such positive edges will have some time offset due to delays associated with the buffer 48. Further, each logic high portion of the clock output signal 26a has a predetermined duration, or pulse width, labeled t, that is established by the one-shot 44. Thus, the clock output signal 26a has a period that is substantially equal to the period of the clock input signal 22a and a duty cycle that is independent of the duty cycle of the input clock signal. In this way, the clock circuit 40a preserves the period of the clock input signal 22a, but prevents clock signal reductions or increases that can result in clock loss.

As is also apparent, by operation of the alignment circuit 50a, the data output signal 30a is aligned with the falling edges of the clock output signal 26a, for example as is illustrated at times $t_1, t_2, t_3, t_4$, and $t_5$. Thus, there is sufficient setup and hold time for the next successive device 14b, since the data output signal 30a is updated on the falling edges of the clock output signal 26a which occur well before the device 14b is next clocked on the next rising edge of the clock output signal. For example, signal 30a which provides the data input signal to device 14b has changed state and is thus ready to be clocked at time $t_1$, whereas the next device 14b will not actually clock in this data until the next rising edge of the clock output signal 26a following time $t_1$, as occurs at time $t_1'$.

Referring also to FIG. 4, an alternative embodiment for the devices 14a-14n of the circuit 10 in FIG. 1 is shown in connection with an illustrative device 14a', in which like components to device 14a of FIG. 2 have like reference numbers. Like device 14a, device 14a' has a data input port 16a for receiving data input signal 18a, a clock input port 20a for receiving clock input signal 22a, a clock output port 24a at which clock output signal 26a is provided, and data output port 28a' at which data output signal 30a' is provided. Device 14a' includes shift register 42, that processes the serial data input signal 18a and includes a plurality of bits $42_0$-$42_x$, with most significant bit $42_0$ and least significant bit $42_x$. The device 14a' further includes data latch 38 having elements $38_0$-$38_x$ coupled to respective elements $42_0$-$42_x$ of the shift register 42 to receive data from the shift register and provide the data on parallel signal lines $36_0$-$36_x$ under the control of a latch signal.

The device 14a' further includes clock circuit 40a that is identical to the clock circuit 40a of device 14a (FIG. 2). Thus, clock circuit 40a includes one-shot 44 that is responsive to the clock input signal 22a for generating one-shot output signal 46. The clock circuit 40a further includes buffer 48 that is responsive to the signal 46 to provide the clock output signal 26a.

The device 14a' differs from the device 14a of FIG. 2 in that the data output signal alignment circuit 50a' synchronizes the data output signal 30a' with the falling edges of the clock input signal 22a (rather than with the falling edges of the clock output signal 26a as in the alignment circuit 50a of FIG. 2). To this end, the alignment circuit 50a' includes an inverter 70 and a flip-flop 74. The inverter provides an inverted version of the clock input signal, signal 72, to the clock input of flip-flop 74. The flip-flop receives the least significant bit $42_x$ from the shift register 42 via signal line 52 and provides the data output signal 30a' for coupling to a successive device 14b.

Figure 5:
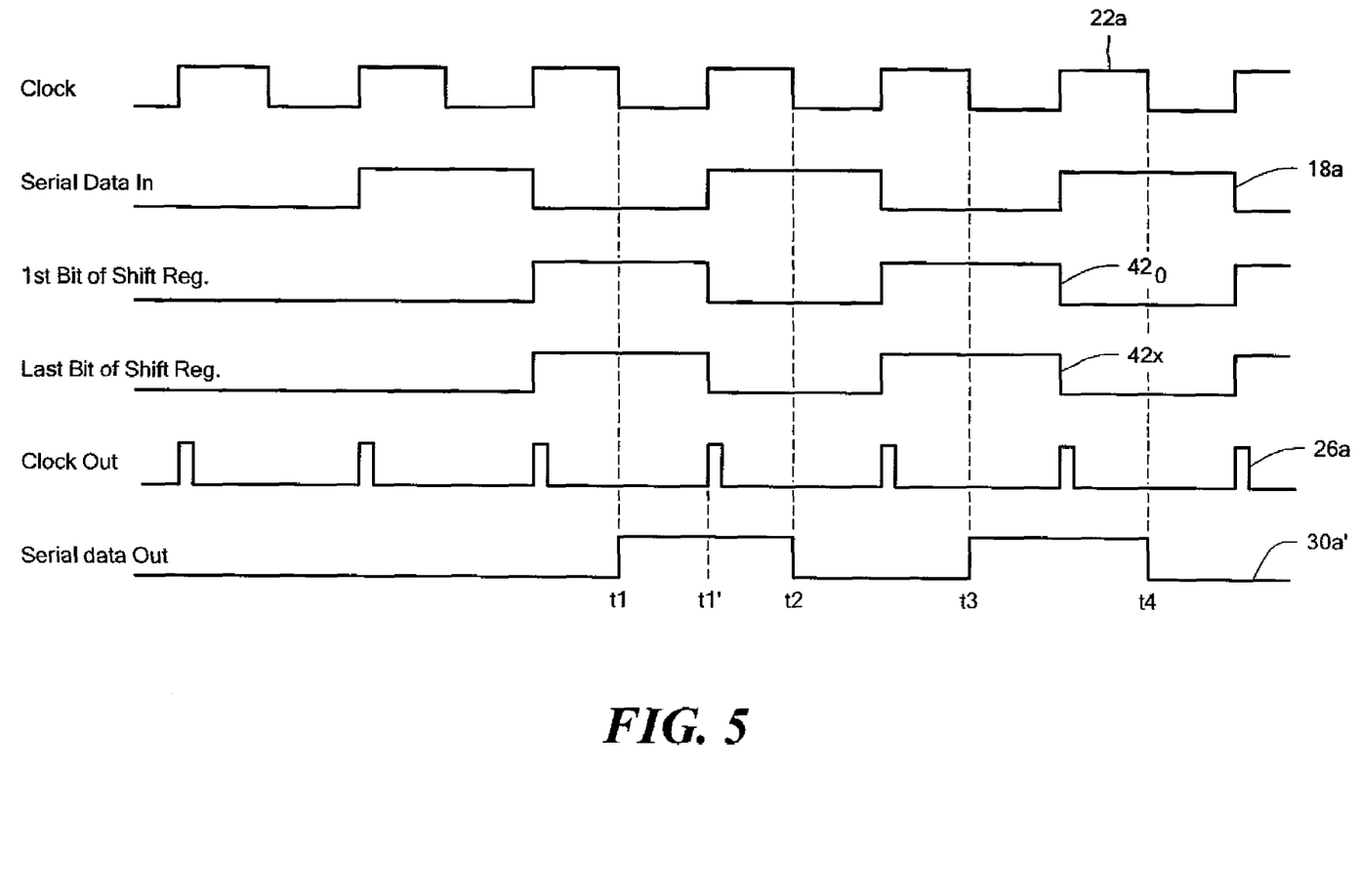
FIG. 5 is a timing diagram showing several illustrative signals associated with the device of FIG. 4.

Referring also to FIG. 5, illustrative waveforms associated with the device 14a' of FIG. 4 are shown. In particular, FIG. 5 shows the clock input signal 22a, the data input signal 18a, the clock output signal 26a, and the data output signal 30a'. Also shown are the least significant bit $42_x$ and the most significant bit $42_0$ of the shift register 42. As is apparent, the clock output signal 26a has rising edges that are substantially aligned with rising edges of the clock input signal 22a, albeit slightly offset in time due to the buffer 48. Each logic high portion of the clock output signal 26a has a predetermined duration, or pulse width, labeled t, that is established by the one-shot 44. Thus, the clock output signal 26a has a period substantially equal to the period of the clock input signal 22a and a duty cycle that is independent of the duty cycle of the input clock signal. In this way, the clock circuit 40a preserves the period of the clock input signal 22a, but prevents clock signal reductions or increases that can result in clock loss.

As is also apparent, by operation of the alignment circuit 50a', the data output signal 30a' is aligned with the falling edges of the clock input signal 22a, for example as is illustrated at times $t_1, t_2, t_3$, and $t_4$. With this arrangement, data integrity is maintained by providing sufficient setup and hold time at the next device 14b, since the data output signal 30a' is updated on falling edges of the clock input signal 22a, which occur well before the device 14b is next clocked on the next rising edge of the clock output signal 26a. For example, signal 30a' which provides the data input signal to device 14b has changed state and is thus ready to be clocked into device 14b at time $t_1$, whereas the next device 14b will not actually clock in this data until the next rising edge of the clock output signal 26a following time $t_1$, as occurs at time $t_1'$. While the alignment circuit 50a' of FIG. 4 provides sufficient setup and hold time for the next consecutive device 14b, it will be apparent from consideration of FIGS. 3 and 5 that there is somewhat less setup and hold time in this embodiment than in the embodiment of FIG. 2.

Figure 6:
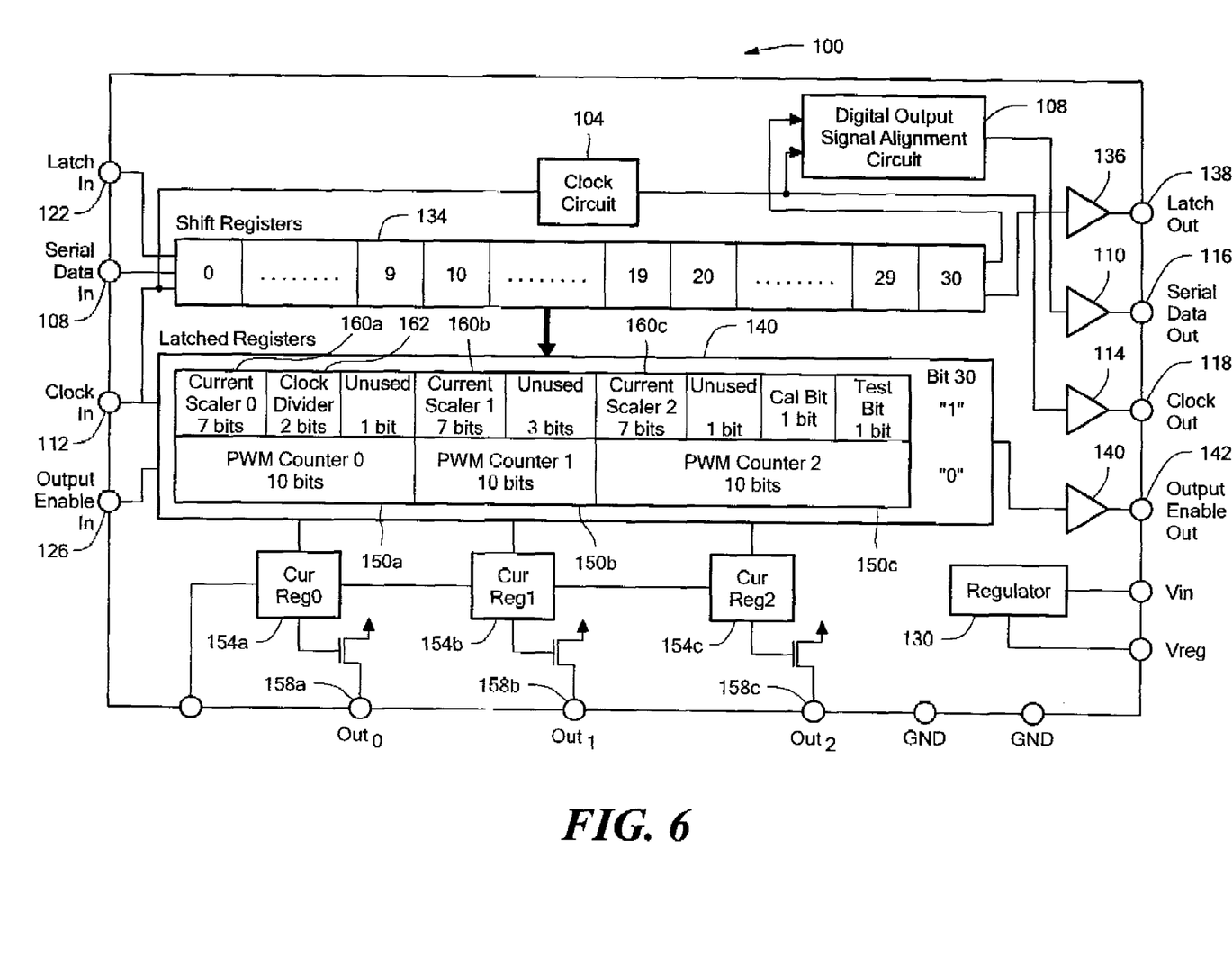
FIG. 6 is a block diagram of an LED driver containing a clock signal regeneration circuit and data output signal alignment circuit according to the invention.

Referring also to FIG. 6, an LED driver 100 includes a clock circuit 104 and a data output signal alignment circuit 108 according to the invention. The LED driver 100 is suitable for coupling in series with other like drivers (not shown). The driver 100 includes a data input port 108 for receiving a data input signal and a clock input port 112 for receiving a clock input signal. The data input signal and the clock input signal are provided by an upstream device in arrangements where driver 100 is not the first device in a daisy-chain arrangement or alternatively, are provided by a controller in the case where the driver is the first device in the daisy-chain arrangement. The driver further includes a data output port 116 at which a buffered data output signal (like data output signal 30 of FIGS. 2 and 3 or like data output signal 30' of FIGS. 4 and 5) is provided at the output of a buffer 110 and a clock output port 118 at which a clock output signal (like clock output signal 26a of FIGS. 2-5) is provided at the output of a buffer 114. The data output signal and the clock output signal are coupled to a next successive device in arrangements where the driver is not the last device in a daisy-chain arrangement or alternatively, are not connected further in arrangements where the driver is the last device in the daisy-chain arrangement.

The driver 100 is a 3-bit constant current LED driver and has parallel data output ports 158a, 158b, and 158c at which the current is provided. Additional inputs to the driver 100 include a latch input port 122 and an enable input port 126. The latch input port 122 receives a latch signal from the preceding driver or from a controller and the enable input port 126 receives an enable signal from the preceding driver or from a controller. When the driver 100 is not the last device in a daisy-chain arrangement, the latch input signal is buffered by a buffer 136 and provided at a latch output port 138 for coupling to the next successive device and similarly, the enable input signal is buffered by a buffer 140 and provided at an enable output port 142 for coupling to the next successive device. The driver 100 contains a regulator 130 that receives an input voltage, Vin, as may be provided by the LED voltage supply bus or from a separate chip supply bus, as examples. The regulator 130 provides a regulated voltage, Vreg, to the driver circuitry. The overall maximum current of the LED driver 100 is set by an external resistor (not shown). Once set, the maximum current will remain constant regardless of the LED voltage variation, supply voltage variation, temperature or other circuit parameters that could otherwise affect the LED current.

A shift register, here a 31-bit shift register 134, is coupled between the data input port 108 and the serial data output port 116. The shift register 134 is responsive to the clock input signal for shifting the data through the shift register to latch registers 140. The data is latched into the latch registers 140 on rising edges of the latch input signal. The enable signal enables or disables the parallel output ports 158a-158c, and can be used for various other functions, such as resetting timers within the driver for example.

The driver 100, includes Pulse Width Modulation (PWM) control to control the LED luminance. More particularly, the driver 100 includes three 10-bit registers 150a, 150b, and 150c in which is stored the luminance data of the PWM signal in response to the data loaded into the shift register 134. The luminance registers set the PWM count value at which the respective outputs switch off during each PWM cycle. The counter resets back to zero on a rising edge of the input enable signal. The PWM registers 150a, 150b, and 150c are clocked by the same clock input signal as the shift register 134.

The driver 100 further permits dot correction at each output 158a-158c. Dot correction refers generally to a calibration of the level of illumination of the LEDs. To this end, three 7-bit registers 160a, 160b, and 160c are provided, each of which is capable of scaling the maximum current provided at the respective output 158a, 158b, and 158c from 100% down to 36.5% in the illustrative embodiment. This feature is useful since not every type of LED has the same level of brightness or intensity for any given current and the brightness could be different even from LED to LED. The dot correction data 162 is latched on a rising edge of the latch input signal and remains latched on a rising enable signal.

The latched registers 140 include two bits of clock divider data 162 to attenuate the clock input signal as may be desired to optimize use of the driver 100 in a particular application. In one illustrative embodiment, the PWM counter is incremented on every rising edge of the clock input signal divided by the clock divider value when the enable signal is low. In this example, if the clock divider is programmed to divide the clock input signal by two, the PWM counter increments on every two clock input signal cycles. The clock divider data 162 is latched on a rising edge of the latch input signal and the latched clock divider data remains latched on a rising edge of the enable signal. Each of the registers 150a, 150b, 150c is coupled to a respective current regulator 154a, 154b, 154c that provides the constant current. One bit of the input data signal is used to control whether dot correction/clock divider ratio or luminance data is loaded into the output registers 150a 150b, and 150c and the remaining 30 bits are used for the data.

The clock circuit 104 can be provided by the clock circuit 40a of FIGS. 2 and 4 and more generally, provides the clock output signal having a period substantially equal to the period of the clock input signal and a duty cycle that is independent of the duty cycle of the clock input signal. With this arrangement, data integrity is improved by eliminating clock loss.

The data output signal alignment circuit 108 can be provided by the alignment circuit 50a of FIG. 2 that aligns the data output signal provided at port 116 with the clock output signal or the alignment circuit 50a' of FIG. 4 that aligns the data output signal provided at port 116 with the clock input signal to achieve the same benefits as described above of improving data integrity by providing sufficient setup and hold times for successive devices.

All references cited herein are hereby incorporated herein by reference in their entirety.

Having described preferred embodiments of the invention, it will now become apparent to one of ordinary skill in the art that other embodiments incorporating their concepts may be used.

For example, as will be appreciated by those of ordinary skill in the art, the clock signal regeneration circuit described herein and the data output signal alignment circuits may be used together in a series coupled device, as shown in the embodiments of FIGS. 2, 4, and 6. Alternatively, the clock signal regeneration circuit may be used in a device that does not also contain the data output signal alignment circuit and likewise, the data output signal alignment circuit may be used in a device that does not also contain the clock signal regeneration circuit.

It will also be appreciated that various circuits and components may be used to realize the clock signal regeneration circuit and the data output signal alignment circuits described herein. For example, circuits other than a conventional one-shot may be used to achieve the inventive clock output signal that has a period substantially equal to the period of the clock input signal and a duty cycle that is independent of the duty cycle of the clock input signal. And of course, there are various ways to implement a one-shot circuit in embodiments in which a one-shot is used to achieve the inventive clock output signal. Similarly, circuitry other than a flip-flop as is used in the illustrated data output signal alignment circuits may be used to provide the inventive data output signal that is aligned with non-clock-triggering edges of a selected one of the clock output signal or the clock input signal.

is felt therefore that these embodiments should not be limited to disclosed embodiments, but rather should be limited only by the spirit and scope of the appended claims.

What is claimed is:

1. Apparatus, comprising:
   a first device comprising: (a) a first clock input port for receiving a first clock input signal;
   (b) a first clock output port at which a first clock output signal is provided; and
   (c) a first clock circuit coupled between the first clock input port and the first clock output port for processing the first clock input signal to provide the first clock output signal having a period that is substantially equal to a period of the first clock input signal and a duty cycle that is independent of a duty cycle of the first clock input signal; and
   a second device serially coupled to the first device, the second device comprising: (a) a second clock input port the first clock output port of the first device for receiving the first clock output signal as a second clock input signal;

(b) a second clock output port at which a second clock output signal is provided for coupling to at least one other device; and (c) a second clock circuit coupled between the second clock input port and the second clock output port for processing the second clock input signal to provide the second clock output signal having a period that is substantially equal to a period of the second clock input signal and a duty cycle that is independent of a duty cycle of the second clock input signal.

2. The apparatus of claim 1 wherein the first clock circuit comprises:

a first one-shot responsive to the first clock input signal to generate a first one-shot output signal that is in a selected one of a logic high state or a logic low state for a first predetermined duration; and a first buffer responsive to the first one-shot output signal to provide the first clock output signal, wherein the period of the first clock input signal is greater than the first predetermined duration; and the second clock circuit comprises: a second one-shot responsive to the second clock input signal to generate a second one-shot output signal that is in a selected one of a logic high state or a logic low state for a second predetermined duration; and a second buffer responsive to the second one-shot output signal to provide the second clock output signal, wherein the period of the second clock input signal is greater than the second predetermined duration.

3. The apparatus of claim 2 wherein each of the first and second one-shot output signals has a selected one of rising edges or falling edges substantially coinciding with a respective one of rising edges or falling edges of the respective first and second clock input signals.

4. The apparatus of claim 1 wherein the first device further comprises:

a first data input port for receiving a first data input signal;
a first data output port at which a first data output signal is provided; and
a first shift register coupled between the first data input port and the first data output port and responsive to the first clock input signal for shifting the first data input signal through the first shift register; and the second device further comprises: a second data input port coupled to the first data output port of the first device for receiving the first data output signal as a second data input signal;
a second data output port at which a second data output signal is provided for coupling to the at least one other device; and
a second shift register coupled between the second data input port and the second data output port and responsive to the second clock input signal for shifting the second data input signal through the second shift register.

5. The apparatus of claim 4 wherein the first device further comprises: a first data output signal alignment circuit coupled to the first shift register and responsive to the first clock output signal for aligning the first data output signal with a non-clock-triggering edge of the first clock output signal; and the second device further comprises: a second data output signal alignment circuit coupled to the second shift register and responsive to the second clock output signal for aligning the second data output signal with a non-clock-triggering edge of the second clock output signal.

6. The apparatus of claim 4 wherein the first device further comprises: a first data output signal alignment circuit coupled to the first shift register and responsive to the first clock input signal for aligning the first data output signal with a non-clock-triggering edge of the first clock input signal; and the second device further comprises: a second data output signal alignment circuit coupled to the second shift register and responsive to the second clock input signal for aligning the second data output signal with a non-clock-triggering edge of the second clock input signal.

7. The apparatus of claim 1 wherein the apparatus is a display driver.

8. A method comprising:

in response to a first clock input signal coupled to a first device, generating a first signal having a period substantially equal to a period of the first clock input signal and a duty cycle that is independent of a duty cycle of the first clock input signal;

buffering the first signal to provide a first clock output signal to a serially coupled, second device;

in response to the first clock output signal coupled to the second device, generating a second having a period substantially equal to a period of the first clock output signal and a duty cycle that is independent of a duty cycle of the first clock output signal; and buffering the second signal to provide a second clock output signal.

9. The method of claim 8 wherein generating first signal comprises substantially aligning a selected one of rising edges or falling edges of the first signal with a respective one of rising edges or falling edges of the first clock input signal; and generating the second signal comprises substantially aligning a selected one of rising edges or falling edges of the second signal with a respective one of rising edges or falling edges of the first clock output signal.

10. The method of claim 9 wherein generating the first signal comprises substantially aligning rising edges of the first signal with rising edges of the first clock input signal; and generating the second signal comprises substantially aligning rising edges of the second signal with rising edges of the first clock output signal.

11. The method of claim 8 wherein generating the first signal comprises providing the first signal in a selected one of a logic high state or a logic low state for a predetermined duration; and generating the second signal comprises providing the second signal in a selected one of a logic high state or a logic low state for the predetermined duration.

12. The method of claim 11 wherein the period of the first clock input signal is greater than the predetermined duration.

13. A device suitable for coupling in series to at least one other device, comprising:

(a) a clock input port for receiving a clock input signal;
(b) a clock output port at which a clock output signal is provided for coupling to the at least one other device;
(c) a data input port for receiving a data input signal;
(d) a data output port at which a data output signal is provided for coupling to the at least one other device;
(e) a shift register coupled between the data input port and the data output port and responsive to the clock input signal for shifting the data input signal through the shift register; and
(f) a data output signal alignment circuit coupled to a last bit of the shift register to align the data output signal with a non-clock-triggering edge of a selected one of the clock input signal or the clock output signal.

14. The device of claim 13 wherein the data output signal alignment circuit is responsive to the clock output signal to align the data output signal with the clock output signal.

15. The device of claim 14 wherein the data output signal alignment circuit is operative to align the data output signal with falling edges of the clock output signal.

16. The device of claim 13 wherein the data output signal alignment circuit responsive to the clock input signal to align the data output signal with the clock input signal.

17. The device of claim 13 wherein the data output signal alignment circuit comprises a flip-flop and wherein the data output signal is provided at an output of the flip-flop.

18. The device of claim 13 further comprising a clock circuit coupled between the clock input port and the clock output port for processing the clock input signal to provide the clock output signal having a period that is substantially equal to a period of the clock input signal and having a duty cycle that is independent of a duty cycle of the clock input signal.

19. The device of claim 18 wherein the clock circuit comprises:
a one-shot responsive to the clock input signal to generate a one-shot output signal that is in a selected one of a logic high state or a logic low state for a predetermined duration; and
a buffer responsive to the one-shot output signal to provide the clock output signal, wherein the period of the clock input signal is greater than the predetermined duration.

20. The device of claim 13 wherein the device is a display driver.

21. A method for processing a data input signal to a series coupled device to provide a data output signal for coupling to a successive device, the device being responsive to a clock input signal and providing a clock output signal to the successive device, the method comprising:
aligning the data output signal with non-clock-triggering edges of a selected one of the clock output signal or the clock input signal.

22. The method of claim 21 wherein aligning comprises aligning the data output signal with falling edges of the clock output signal.

23. The method of claim 21 further comprising processing the clock input signal to generate the clock output signal having a period substantially equal to a period of the clock input signal and a duty cycle that is independent of a duty cycle of the clock input signal.

24. A device suitable for coupling in series to at least one other device, comprising:
(a) a clock input port for receiving a clock input signal;
(b) a clock output port at which a clock output signal is provided for coupling to the at least one other device; and
(c) a clock circuit coupled between the clock input port and the clock output port for processing the clock input signal to provide the clock output signal having a period that is substantially equal to a period of the clock input signal and a duty cycle that is independent of a duty cycle of the clock input signal, wherein the clock circuit comprises a one-shot responsive to the clock input signal to generate a one-shot output signal that is in a selected one of a logic high state or a logic low state for a predetermined duration and, a buffer responsive to the one-shot output signal to provide the clock output signal, wherein the period of the clock input signal is greater than the predetermined duration.

* * * * *

UNITED STATES PATENT AND TRADEMARK OFFICE
CERTIFICATE OF CORRECTION

PATENT NO. : 7,436,217 B2  
APPLICATION NO. : 11/426626  
DATED : October 14, 2008  
INVENTOR(S) : Zachary D. Lewko It is certified that error appears in the above-identified patent and that said Letters Patent is hereby corrected as shown below:

Col. 10, line 46, delete "is" and replace with -- It is --.

Col. 10, line 64-65, delete "port the" and replace with -- port coupled to the --.

Col. 12, line 20, delete "oft he" and replace with -- of the --.

Signed and Sealed this

Thirtieth Day of December, 2008

JON W. DUDAS  
*Director of the United States Patent and Trademark Office*